United States Patent
Cheng

(10) Patent No.: US 7,262,965 B2
(45) Date of Patent: Aug. 28, 2007

(54) THERMAL STRUCTURE FOR ELECTRIC DEVICES

(75) Inventor: Jung-Hsiang Cheng, Taipei (TW)

(73) Assignee: Shuttle Inc., Taipei (TW)

( * ) Notice: Subject to any disclaimer, the term of this patent is extended or adjusted under 35 U.S.C. 154(b) by 0 days.

(21) Appl. No.: 11/264,342

(22) Filed: Oct. 28, 2005

(65) Prior Publication Data

US 2007/0097643 A1 May 3, 2007

(51) Int. Cl.
*H05K 7/20* (2006.01)
*F28F 7/00* (2006.01)

(52) U.S. Cl. .................. 361/697; 361/696; 361/698; 165/80.3; 174/15.1; 174/15.2

(58) Field of Classification Search ............. 361/700, 361/687–690, 701–704, 689, 379, 692, 694–699, 361/709, 711, 679; 353/54; 165/272, 80.2, 165/80.3, 80.4, 104.33; 174/15.2, 15.1, 16.1, 174/16.3; 257/720

See application file for complete search history.

(56) References Cited

U.S. PATENT DOCUMENTS

| | | | | |
|---|---|---|---|---|
| 6,241,007 B1 * | 6/2001 | Kitahara et al. | ........... | 165/80.4 |
| 6,712,129 B1 * | 3/2004 | Lee | ................ | 165/104.21 |
| 6,717,811 B2 * | 4/2004 | Lo et al. | ................ | 361/698 |
| 6,745,824 B2 * | 6/2004 | Lee et al. | ............ | 165/104.14 |
| 6,752,201 B2 * | 6/2004 | Cipolla et al. | ............ | 165/121 |
| 6,771,497 B2 * | 8/2004 | Chen et al. | ............... | 361/687 |
| 6,781,835 B2 * | 8/2004 | Hashimoto et al. | ......... | 361/697 |
| 6,871,702 B2 * | 3/2005 | Horng et al. | ......... | 165/104.33 |
| 2004/0027805 A1 * | 2/2004 | Lai | .......................... | 361/700 |
| 2004/0037039 A1 * | 2/2004 | Shimura et al. | ........... | 361/700 |
| 2005/0139347 A1 * | 6/2005 | Chen et al. | ........... | 165/104.33 |
| 2005/0259405 A1 * | 11/2005 | He | ............................ | 361/729 |
| 2006/0002081 A1 * | 1/2006 | Hongo et al. | .............. | 361/691 |
| 2006/0034055 A1 * | 2/2006 | Mok | ......................... | 361/700 |
| 2006/0126305 A1 * | 6/2006 | Xia et al. | .................. | 361/704 |
| 2006/0137861 A1 * | 6/2006 | Wang et al. | ........... | 165/104.33 |

\* cited by examiner

*Primary Examiner*—Jayprakash Gandhi
*Assistant Examiner*—Anthony M Haughton
(74) *Attorney, Agent, or Firm*—Birch, Stewart, Kolasch & Birch, LLP

(57) ABSTRACT

A thermal structure includes a fin module, a heat sink base, a heat pipe, a fan housing, and a fan. One end of the heat pipe is connected with the fin module and the other end of the heat pipe is installed on the heat sink base. The fan housing is fixed on the fin module. Blades are installed inside the fan housing. The fan includes inlets on an upper surface and a lower surface of the fan housing and a outlet on a side surface of the fan housing, so as to absorb heat through the inlet and eliminate the heat through the outlet. Therefore, the heat dissipating efficiency is improved.

4 Claims, 7 Drawing Sheets

THERMAL STRUCTURE FOR ELECTRIC DEVICES

BACKGROUND OF THE INVENTION

1. Field of the Invention

The present invention relates to a thermal structure, and particularly relates to a thermal stricture, suitable for thin electric devices, having a good heat dissipating efficiency.

2. Description of Related Art

With the rapid development of the technology industry, the speed of the computer operation is getting faster, and the heat generated when the computer is operated is getting more and more. In order to take the huge and dense heat away from the computer to external environment and keep the CPU under the allowable temperature for operation, usually, a thermal structure serving as an assistance for heat dissipating from CPU is installed on the CPU. Currently, it is a still necessary for other heat sources else, such as a video graphics card (VGA), to install a further thermal structure. In early stages, a thermal structure is made of an aluminum based material by extruding to form a heat sink with a plurality of fins. The heat sink is directly installed on the CPU or other heat sources else for heat dissipating. Subsequently, in order to improve the heat dissipating efficiency, a heat dissipating fan is installed on the top of the heat sink. The fan and the heat sink are combined to form a thermal structure. The heat generated from the heat sources is taken away to reduce the thermal of the heat sources by an airflow generated by the fan. However, the heat dissipating efficiency of the heat sink or the thermal structure mentioned above is still not sufficient, thus, a thermal plate or a heat pipe is installed below the heat sink. The heat of the sources is rapidly dissipated via flowing and capillarity structures of the thermal plate or the heat pipe. That is a main way to solve thermal problems. The design trend of an electric device is getting lighter, thinner, shorter, and smaller, therefore, the thermal structure is merely installed on a main heat source. However, the heat is still generated by other electric parts or peripheral devices of the electric devices during operation, such as a hard disk driver. If there is no way to take the heat of sources away, the heat will be overflowing with the electric devices, resulted in the effect of the life of the electric devices. Thus, how to improve the heat dissipation in a limited space is the most important subject for solving today.

SUMMARY OF THE INVENTION

The present invention is to provide a thermal structure, such that the heat can be absorbed by a fan and then eliminated through a side surface of the fan. A cold air is further absorbed into the electric device, such that the heat and the cold air arc exchanged in the fin module. Then, the heat is eliminated through a outlet on a side surface of the fan. Therefore, the heat dissipating efficiency is improved.

The thermal structure of the present invention comprises a fin module, a heat sink base, at least a heat pipe, a fan housing and a fin. The heat sink base is installed aside the fin module. One end of the beat pipe is connected with the fin module mid the other end of the heat pipe is installed on the heat sink base, a fan housing is fixed on the fin module. The fan includes inlets on an upper surface and a lower surface of the fan housing and a outlet on a side surface of the fan housing, so as to absorb heat through the inlet and eliminate the heat through the outlet.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

The following provides exemplary embodiments of the present invention with reference to the accompanying drawings.

Figure 1:
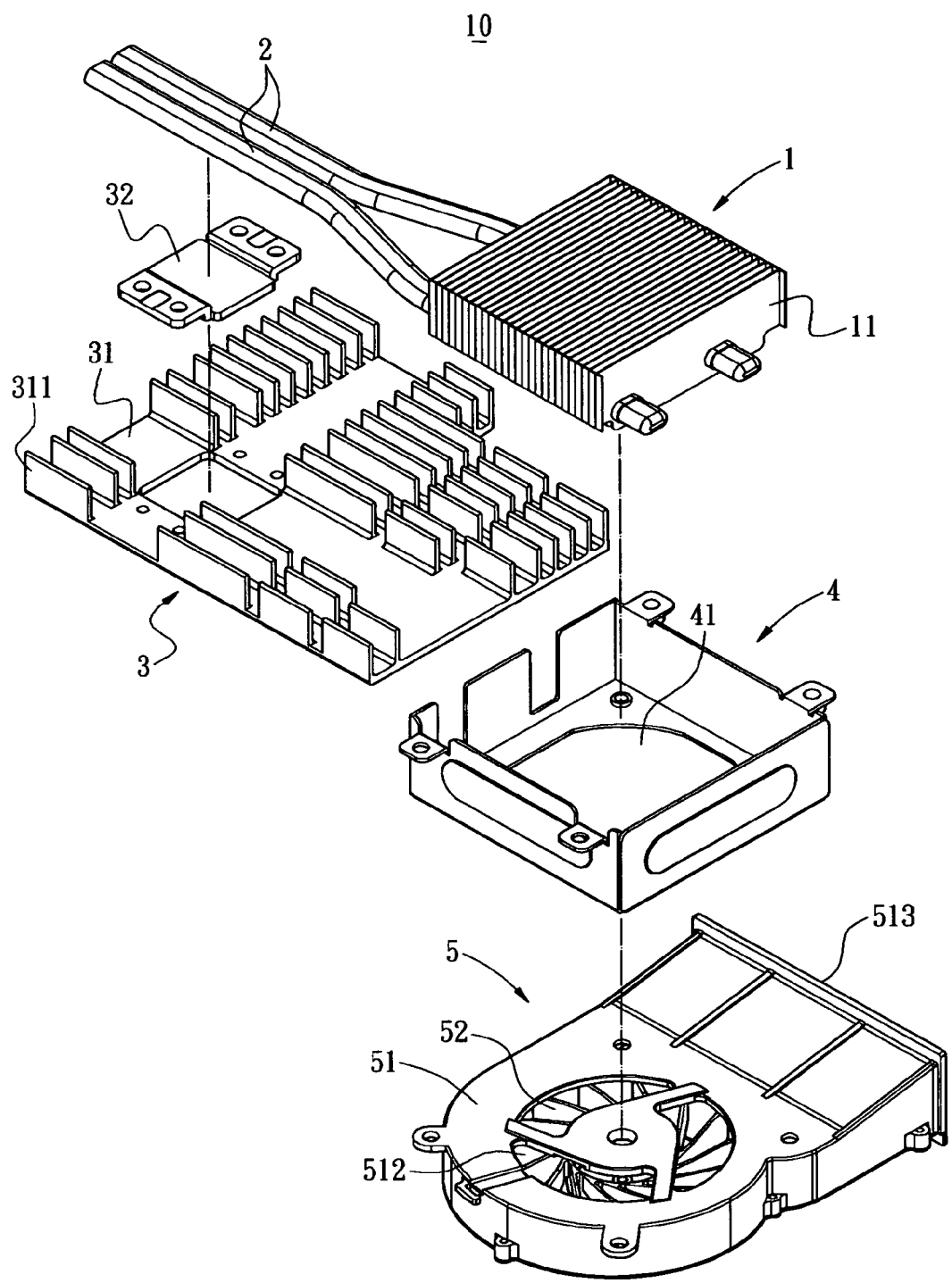
FIG. 1 is a perspective exploded view showing an embodiment of the present invention.
Figure 2:
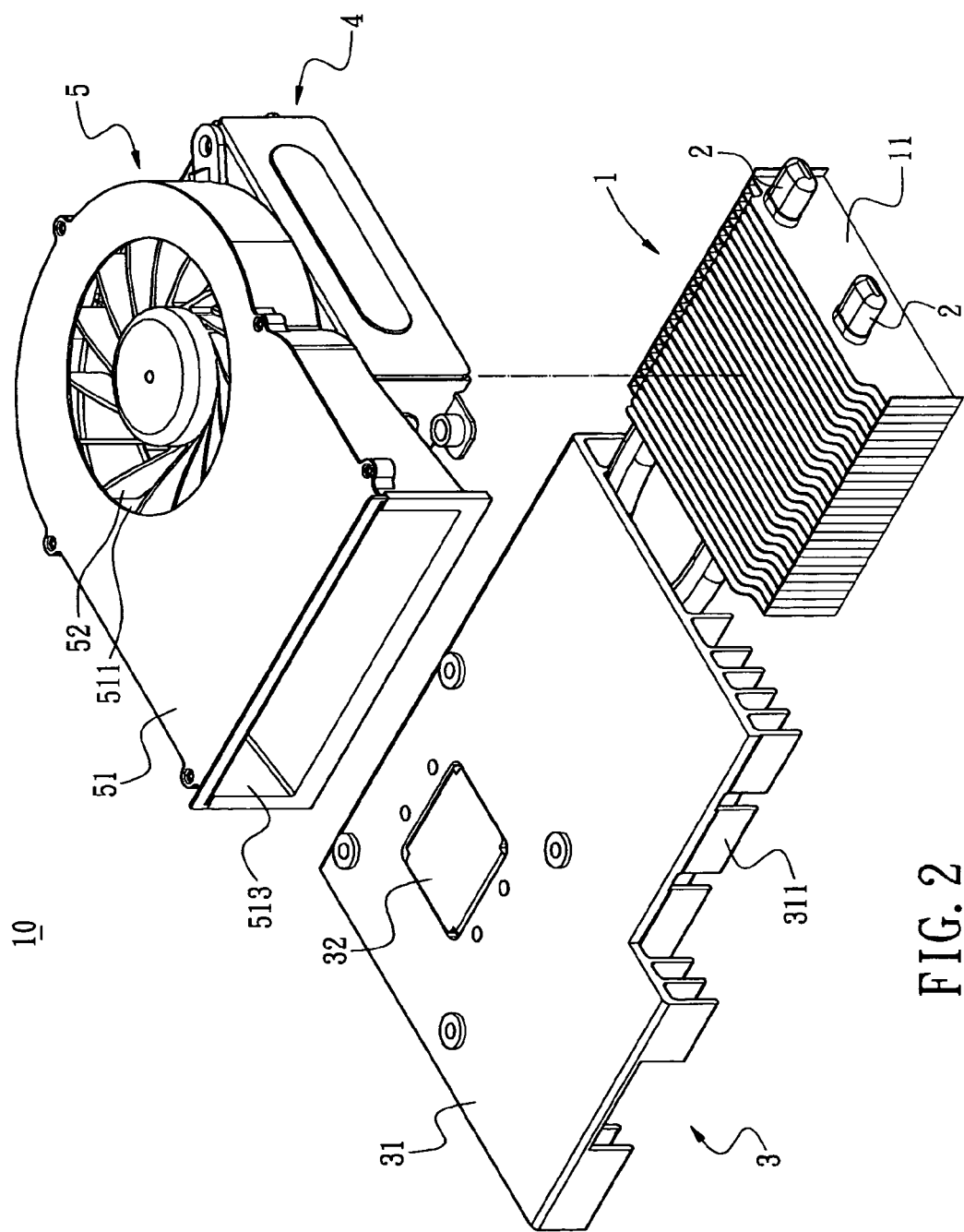
FIG. 2 is a perspective exploded view showing an embodiment of the present invention according to another view.

In FIG. 1 and FIG. 2, a thermal structure 10 comprises a fin module 1 consisting of a plurality of fins 11 stacked together. The fin module 1 is connected with a heat pipe 2 extending to a heat sink base 3. The heat sink base 3 may be made of an aluminum extrude shaped plate 31, a thermal bulk 32 fixed on the central area of the heat sink base 3, or the combination thereof. The level of the base of the thermal bulk 32 may be equal to or higher tan the base of the aluminum extrude shaped plate 31. In addition, a plurality of heat sink fins 311 are formed on the aluminum extrude shaped plate 31.

Furthermore, a fan cover 4 is installed on the fin module 1. A fan 5 comprising a fan housing 51 and blades 52 is installed on the fan cover 4. An opening 41 is formed on the surface where the fan cover 4 and the fan 5 are joined. In the present embodiment, the fan 5 is a centrifugal fan, and inlets 511, 512 are formed corresponding to the axis of the blades 52 on an upper surface and a lower surface of the fan housing 51. An outlet 513 is formed on a side surface of the fan housing 51.

Figure 3:
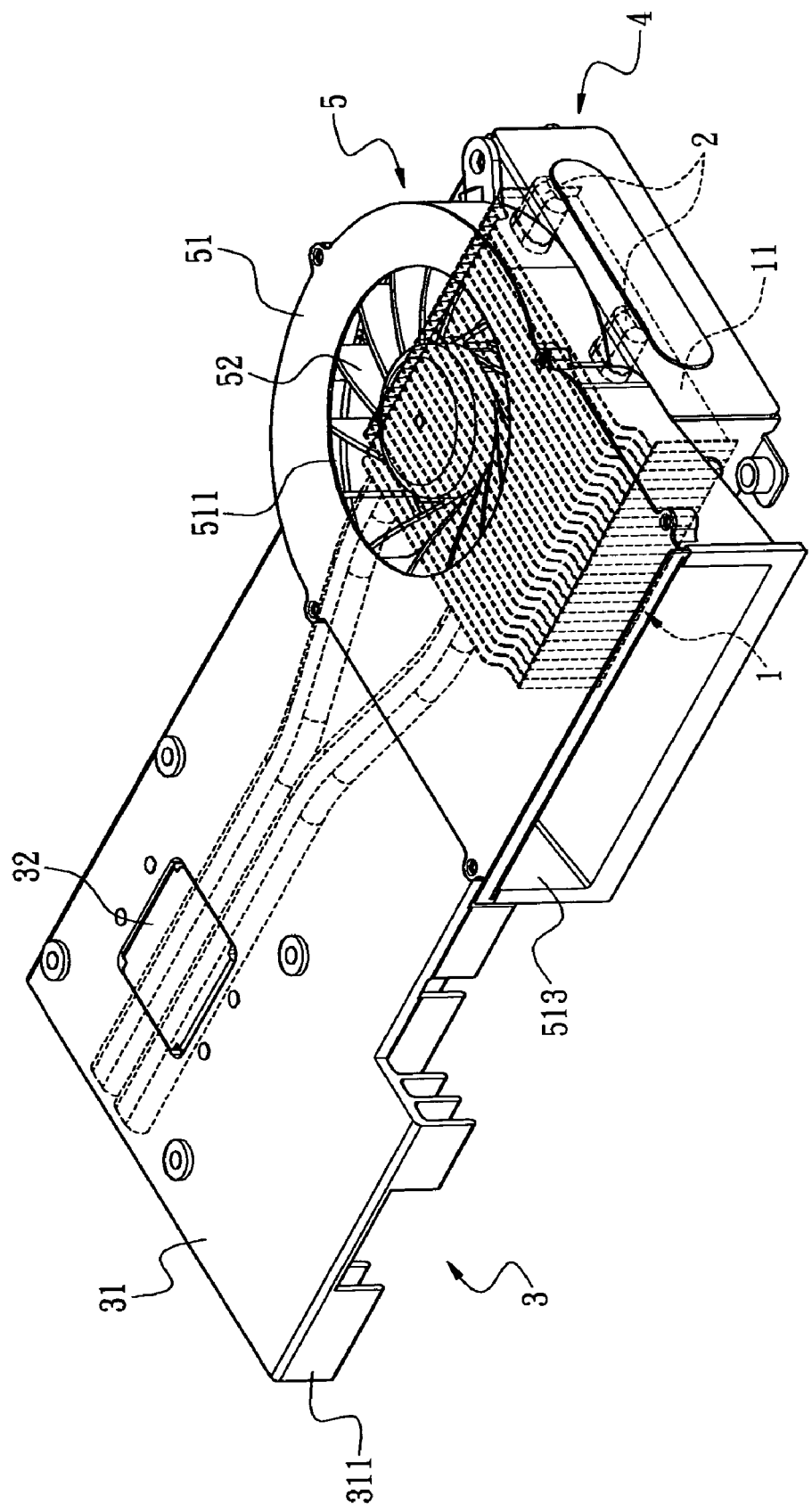
FIG. 3 is a perspective assembly view showing an embodiment of the present invention.

In FIG. 3, dining assembling, the thermal bulk 32 is placed into a hole of the aluminum extrude shaped plate 31 and fixed by screws, such that the base of the thermal bulk 32 and the base of the aluminum extrude shaped plate 31 are at the same level. Next, the fan 5 is fixed on the fan housing 4 by screwing. The fan housing 4 is then installed on the fin module 1. Therefore, the heat of the fin module can be absorbed through the opening 41 of the fan cover 4 and the inlet 512 of the fan housing.

Figure 4:
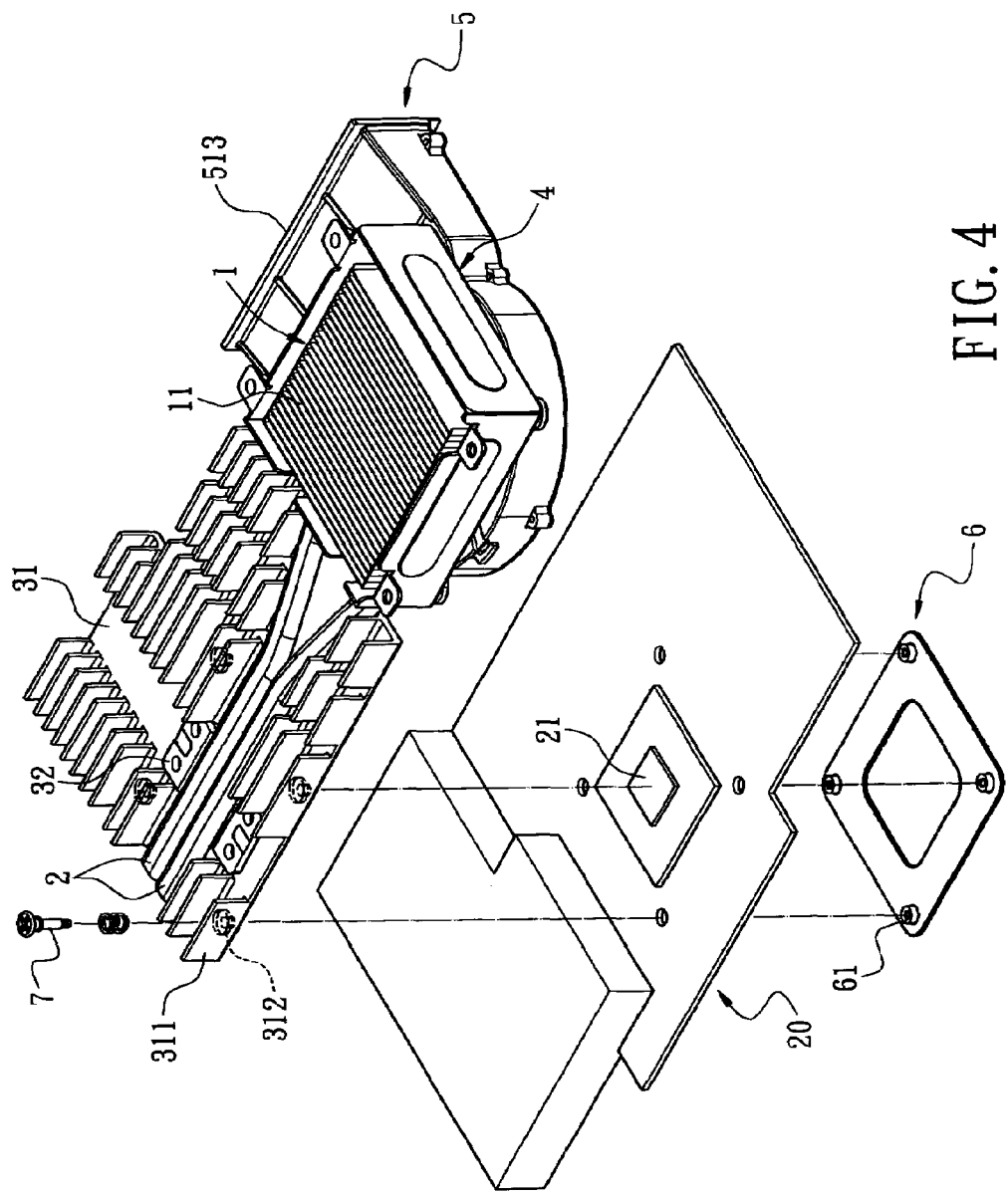
FIG. 4 is a perspective exploded view showing an embodiment of the present invention with a video graphic card.
Figure 5:
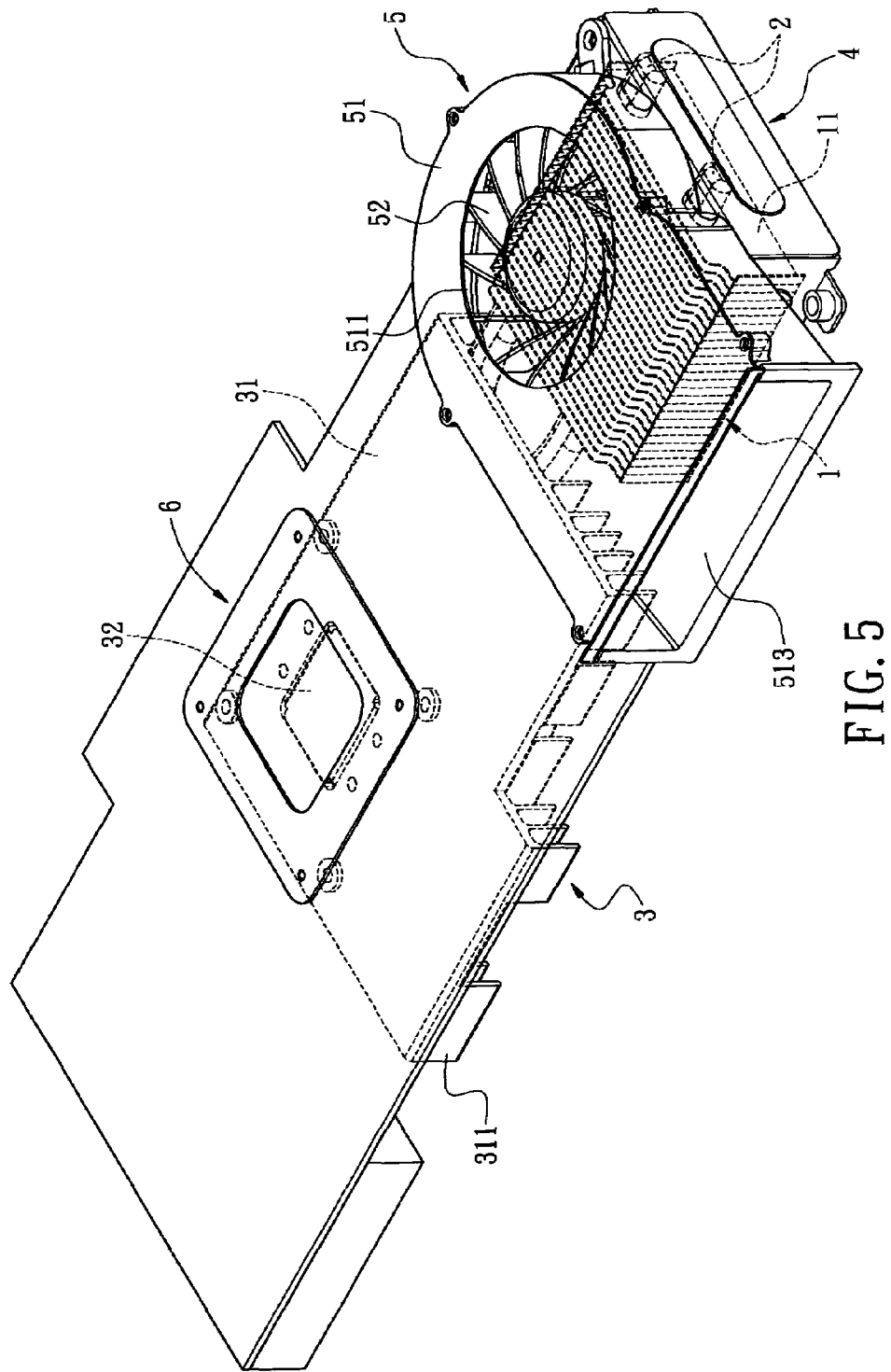
FIG. 5 an assembled view showing an embodiment of the present invention with a video graphic card.

In FIG. 4 and FIG. 5, the thermal structure 10 of the present invention is suitable for installing on a video graphic card 20 having a chip 21 and electric devices with other else functions thereon. The thermal structure 10 further comprises a holder 6. Protruding bars 61 are set at the corner of the holder 6. A screwing hole is formed in the central of the protruding bars 61. Through holes 312 are formed corresponding to the protruding bars 61 nearby the corner of the thermal bulk 32 on the aluminum extrude shaped plate 31. The lower surface of the thermal bulk 32 is connected with the upper surface of the chip 21 of the video graphic card 20. The holder 6 is installed below the video graphic card 20 and fixed by fixing devices 7, such as screws. The video graphic card 20 is fixed between the holder 6 and the thermal module 10 by clamping.

Figure 6:
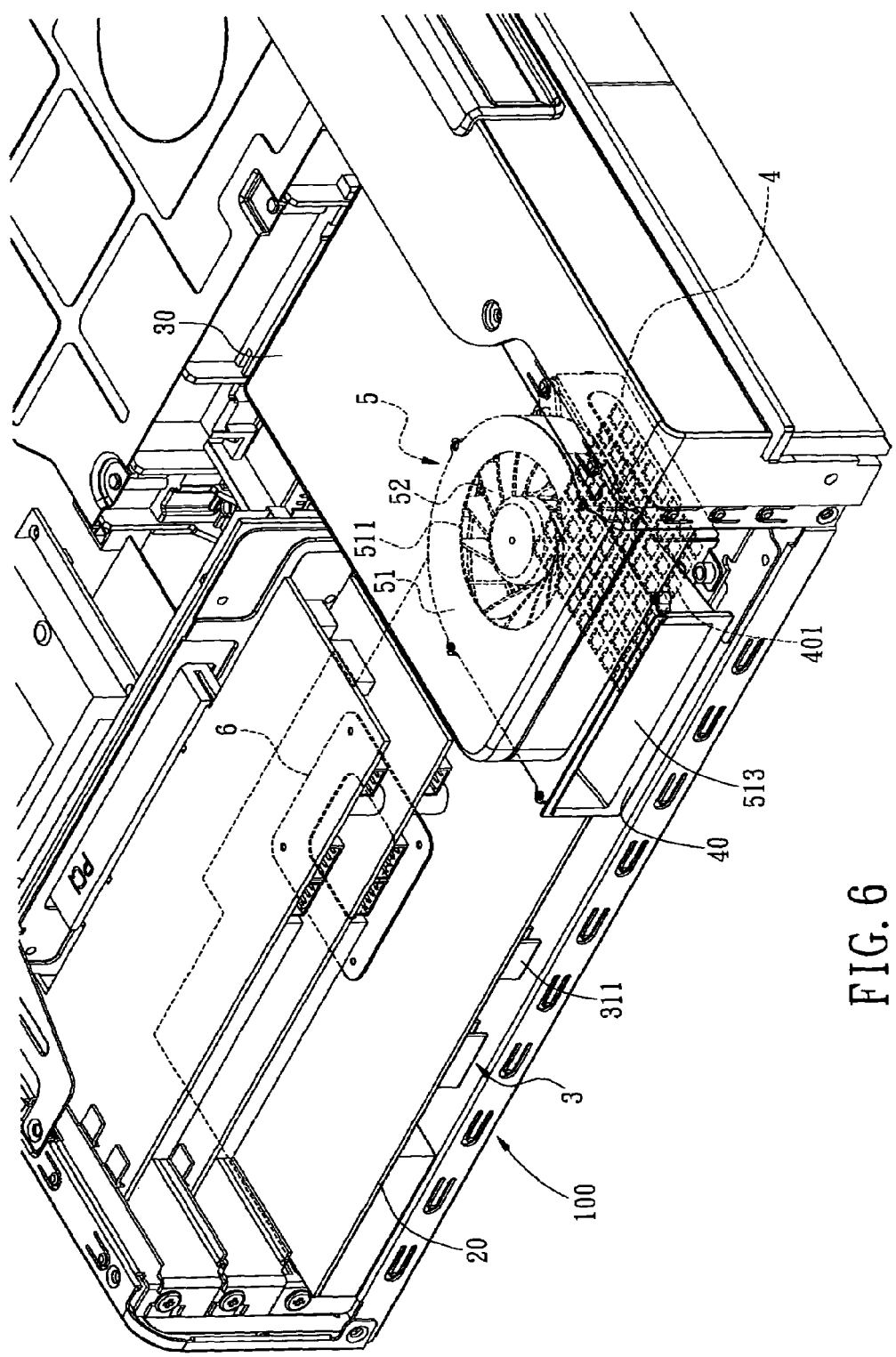
FIG. 6 is a perspective schematic view showing an embodiment of the present invention inside an electric device.
Figure 7:
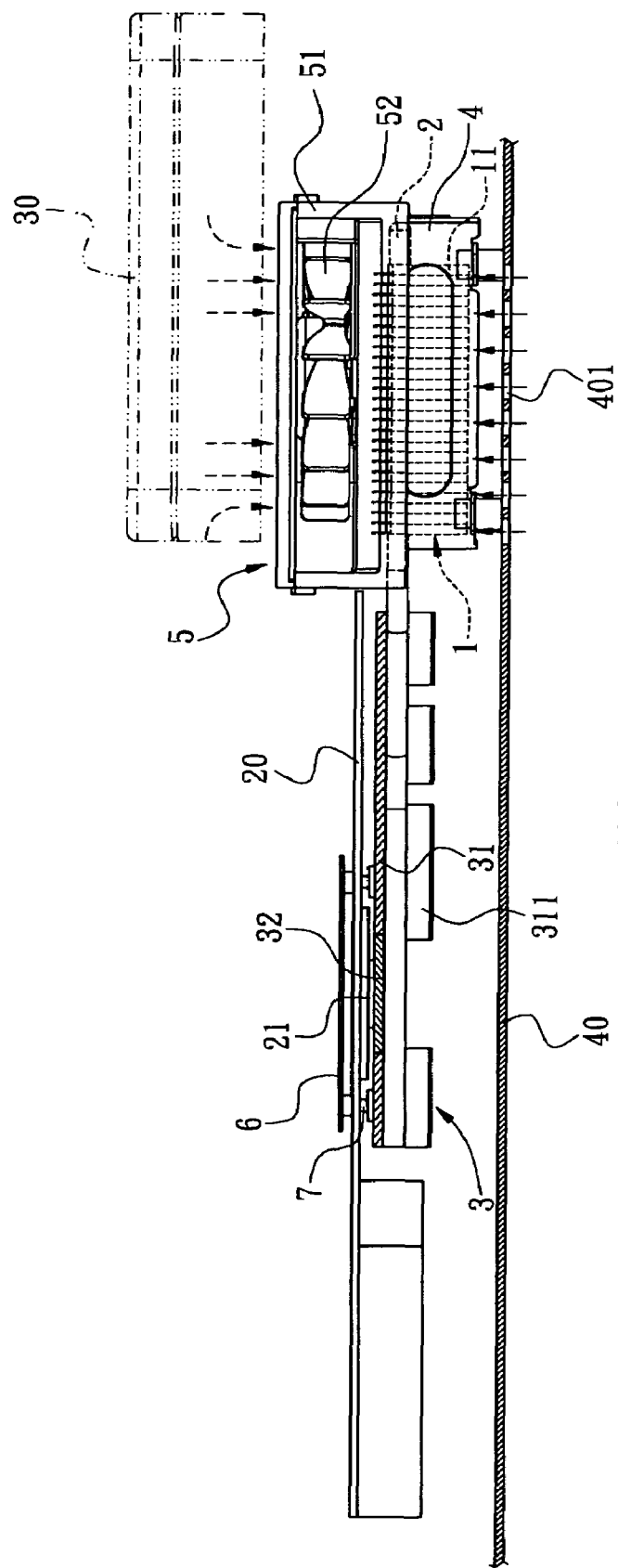
FIG. 7 is a schematic view illustrating an embodiment of the present invention during operation.

In FIG. 6 and FIG. 7, the thermal structure 10 and the video graphic card 20 can be assembled into a thin electric device 100, such as a laptop or a thin video media player. The video graphic card 20 is inserted into a connector of the thin electric device 100. The hard disk drive 30 is located on the fan 5, such that the inlet 511 of the fan housing 51 is corresponding to the hard disk drive 30, and the outlet 513 of the fan housing 51 is nearby the case of the thin electric device 100.

During the operation of the thin electric device 100, beat is generated by various electric devices and peripheral devices inside the thin electric device. Parts of the heat generated by the chip 21 of the video graphic card 20 is eliminated by conducting through the thermal bulk 32 and the aluminum extrude shaped plate 31, and parts of that is rapidly transferred to fin module 1 by heat pipe 2. When the fan 5 is operated, the heat in the fin module 1 is absorbed through the inlet 512 of the fan housing and then eliminated through the outlet 513 of the fan housing 51. Therefore, by this way, most heat generated inside the electric device 100 can be absorbed through the inlet 511 aid eliminated by the outlet 513 during the fan is operated.

In the present invention, a plurality of second inlets 401 are formed corresponding to the fin module 1 on the case 40 of the electric device 100, such that a cold air outside can be absorbed through the second inlets 401. Thus, the heat dissipating efficiency of the fin module is more improved.

The thermal structure 10 of the prevent invention comprises two inlets 511, 512, so as to absorb the heat above and below the fan 5 into the fan 5 through the inlets 511, 512 and eliminate the heat through the outlet 513. The heat above and below the fan 5 can be eliminated therefore, the heat dissipating efficiency of the thermal structure 10 is more improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thermal structure, comprising:
    a fin module;
    a heat sink base, installed aside the fin module;
    at least a heat pipe with one end connected with the fin module and the other end installed on the heat sink base;
    a fan housing, fixed on the fin module; and
    a fan, comprising inlets on an upper surface and a lower surface of the fan housing and a outlet on a side surface of the fan housing, so as to absorb heat through the inlet and eliminate the heat through the outlet,
    wherein the heat sink base comprises an aluminum extrude shaped plate with a plurality of fins formed thereon and a thermal bulk connected with the aluminum extrude shaped plate, such that a base of the thermal bulk and a base of the aluminum extrude shaped plate are at the same level.

2. The thermal structure as claimed in claim 1, wherein the fin module is made of a plurality of fins stacked together.

3. The thermal structure as claimed in claim 1, wherein the heat sink base comprises an aluminum extrude shaped plate with a plurality of fins formed thereon and a thermal bulk connected with the aluminum extrude shaped plate, such that a base of the thermal bulk is protruded from a base of the aluminum extrude shaped plate.

4. The thermal structure as claimed in claim 1, wherein the fan comprises a fan housing and blades installed inside the fan housing, and the fan is a centrifugal fan.

* * * * *